United States Patent [19]
Redfield

[11] Patent Number: 4,599,528
[45] Date of Patent: Jul. 8, 1986

[54] SELF BOOTING LOGICAL OR CIRCUIT
[75] Inventor: James W. Redfield, Pottstown, Pa.
[73] Assignee: Commodore Business Machines Inc., West Chester, Pa.
[21] Appl. No.: 458,436
[22] Filed: Jan. 17, 1983
[51] Int. Cl.$^4$ .......................................... H03K 19/096
[52] U.S. Cl. .................................. 307/443; 307/453; 307/481; 307/482
[58] Field of Search ............... 307/443, 445, 448, 453, 307/480-482, 577-578, 583, 269

[56] References Cited
U.S. PATENT DOCUMENTS

| | | | |
|---|---|---|---|
| 3,518,451 | 6/1970 | Booher | 307/443 |
| 3,573,487 | 4/1971 | Polkinghorn | 307/453 |
| 3,651,334 | 3/1972 | Thompson et al. | 307/279 X |
| 3,935,474 | 1/1976 | Komarek | 307/453 X |
| 4,044,270 | 8/1977 | Lesser | 307/481 |
| 4,316,106 | 2/1982 | Young et al. | 307/443 X |

Primary Examiner—Stanley D. Miller
Assistant Examiner—D. R. Hudspeth
Attorney, Agent, or Firm—John J. Simkanich

[57] ABSTRACT

A solid state logical "OR" circuit for implementation with NMOS circuitry has self-booting clock pulse conditioning for ultra fast propagation times and minimal power dissipation, whereof memory row driver concepts are utilized and silicon area is minimized.

9 Claims, 2 Drawing Figures

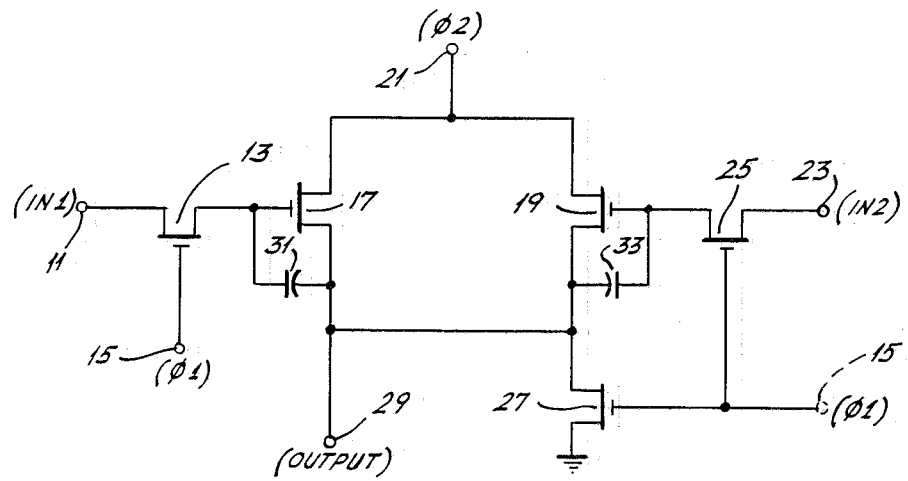
FIG. 1. SELF BOOTING LOGICAL "OR" CIRCUIT
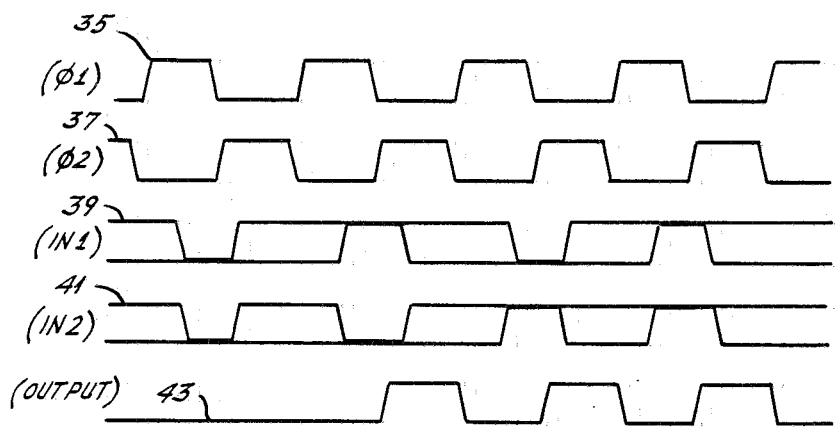
FIG. 2.

SELF BOOTING LOGICAL OR CIRCUIT

BACKGROUND OF THE INVENTION

This invention relates to solid state circuits having a specific dedication to certain aspects i.e. functions in digital logic circuitry. Specifically it relates to circuits for performing logical "OR" functions, and especially such logical "OR" functions, which are implemented within large scale integrated circuits. (LSI).

Certain design methodologies or parameters have in the past dominated circuit design. One of these was that high speed circuits generally required more power and silicon area to implement. High speed circuits are desirable in any application. However, with the advent to mini-computers, micro-processors and LSI circuitry it has become increasingly desirable to increase circuit speed (i.e. minimize propagation or delay times) while minimizing power consumption and size (i.e. silicon area needed to implement a circuit).

Arithmetic decision making circuitry for performing logic functions used in computing hardware are most always operated with clock pulses. Such clock pulses assure synchronous operation, minimize data (bit information) loss and mimimize errors.

An object of the present invention is to utilize the existence of low impedance, non-overlapping clock pulses in logic function operation.

A second object of this invention is to provide such a logic function operation in a circuit which may be operated at much higher speeds than is normally possible using conventional design methodologies.

A further object of this invention is to provide such a logic circuit which utilizes such clock pulse signals to precondition the circuit enabling a fast rise or trigger, i.e. high speed propagation, the application of such preconditioning causing a "self booting" effect on the circuit.

SUMMARY OF THE INVENTION

The objects of this invention are realized in a large scale integrated circuit (LSI) implementation of NMOS technology where a first timing clock pulse, normally present in the circuit environment, is used to condition a gate by building a charge on the trigger pin thereof prior to the switching operation, thereby enabling a minimization of the current drain by the device when this gate is operated and thereby reducing the power consumption of the circuit.

A second non-overlapping clock pulse, which is normally present in the circuit environment is then used to clock the logical operation of the gate.

A first and second silicon circuit components are joined in a paired-juxtaposed (parallel) connection for performing a gating operation to provide a resultant logical "OR" function. A third and fourth silicon circuit components are connected dedicated, one each respectively, to isolate the respective "OR" input signals from each of the first circuit components. The isolation circuit components are each simultaneously pulsed with the second clock pulse thereby booting-up, i.e. by creating a voltage build up on each of the first and/or second circuit components where one would not otherwise occur when the node(s) were preconditioned to a high voltage level during the first clock pulse.

The second clock pulse provides the power to initiate a logical "OR" operation according to input signals on each isolation circuit component.

Implementation of all silicon circuit components may be with field effect transistors (FET's). Propagation times can be greatly reduced as the output signal need only "ripple" across the device channel.

Conditioning capacitors can be utilized across the gate-source junction of the logical "OR" function FET's to achieve high boot voltage and to provide noise immunity.

DESCRIPTION OF THE DRAWINGS

The advantageous, features and operation of this invention will be readily understood from a reading of the following detailed description in conjunction with the accompanying drawings in which like numerals refer to like elements and in which:

FIG. 1 is a diagram of the circuit of the logical "OR" device; and

FIG. 2 is a timing diagram for the operation of the circuit of FIG. 1.

DETAILED DESCRIPTION OF THE INVENTION

A logic "OR" function is implemented in a large scale integrated circuit (LSI) in NMOS type technology, having a first circuit input (INI) node 11, FIG. 1, connected to the drain pin of a first field effect transistor (FET) 13. The gate pin of this FET 13 is connected to a first clock pulse ($\Phi1$) node 15 while this FET 13 source pin is connected to the gate pin of a second FET 17.

The second FET 17 has its drain pin tied to the drain pin of a third FET 19 and its source pin to a second clock pulse ($\Phi2$) node 21.

A second circuit input (IN2) node 23 is connected to the drain pin of a fourth FET 25. The source pin of this fourth FET 25 is connected to the gate pin of the third FET 19 while the gate pin of this fourth FET 25 is connected to the first clock pulse (INI) node 15. The first clock pulse (INI) node 15 is also connected to the gate pin of a fifth FET 27.

The source pin of the second FET 17 is connected to the output node 29, as well as, the source pin of the third FET 19 and the drain pin of the fifth FET 27.

The source pin of this fifth FET 27 is connected to ground.

A first capacitor 31 is connected between the gate and source pins of the second FET 17. A second capacitor 33 is connected across the gate and source pins of the third FET 19.

The timing diagram for the clocked self-booting logical "OR" circuit is seen as FIG. 2.

Line 35 of FIG. 2 represents the first low impedance clock pulse 01 appearing on node 15 of the circuit.

Line 37 represents the inverse signal of line 35.

Line 39 shows a first input node signal.

Line 41 shows the second input node signal, while line 43 represents the "OR'ing" of inputs 1 and 2 (lines 39, 41) to provide the output of the circuit.

The circuit operates as follows: When the low impedance, non-overlapping clock pulses $\Phi1$ and $\Phi2$ are at 5 volts, which is typical for circuit designs and readily available in existing circuitry, $\Phi2$ appears at node 21 so that the gate pin of the second FET 17 will be preconditioned to the level appearing at input 11 and the gate pin of FET 19 will be preconditioned to the level appearing at input 23. Input signals appearing on the first and second circuit input nodes 11, 23, respectively, will be clocked through the circuit in synchronism with the pulses of the first clock pulse Φ1 appearing on its node 15.

Capacitors 31 and 33 are normally implemented with depletion transistors and are included to help minimize charge redistribution onto the parasitic capacitive source region of the FETs 13 and 25 thus providing a higher boot voltage on the gates of FETs 17 and 19, and also increasing noise immunity. The output of the circuit will be provided when Φ2 on circuit node 21 goes high. If either signals on the input nodes 11 and 23 was higher during the Φ1 conditioning phase, the output node will be clocked high.

The fifth FED 27 is used as a shunt device and is removable from the circuit without disrupting its operation except that this FET 27 assures a faster roll off, i.e., a steeper slope when the output signal goes from a high to a low.

By preconditioning the principal switching FET's 17 and 19 the circuit provides a very low DC power drag on its input nodes 11, 23. Moreover, the speed of propogation is greatly increased so that the delay time circuit to circuit is in the order of three to eight nanoseconds behind the clock pulse Φ2 appearing on node 21.

The above description is intended to be illustrative and not be taken in the limiting sense. Various changes and alterations can be developed to this circuit without departing from the intent and scope thereof. These changes and modifications are intended to be within the scope of this invention. As an example, the circuit can be modified to perform a logical "NAND" function by adding an inverter on the input nodes 11, 23 of the logical "OR" circuit.

What is claimed is:

1. An OR circuit having first and second input nodes and an output node for performing a logical "OR" function to provide a signal on its output node in response to signals on its first and second input nodes, said OR circuit operating responsive to first and second non-overlapping timing pulses, comprising:
   a first and second gate operated switching means each having an input electrode, and output electrode and a gate electrode wherein their output electrodes are each connected to said output node and their input electrodes are each connected to receive said second timing pulses whereby an OR function output is performed only in the presence of the second timing pulses by gating the second timing pulses through to the output node;
   a first selective preconditioning and isolating means, connected between said first switching means gate electrode and said first input node, for selectively conditioning a charge on the gate electrode of said first switching means with a signal from said first input node and then selectively isolating said first switching means gate electrode from said first input node;
   a second selective preconditioning and isolating means, connected between said second switching means gate electrode and said second input node, for selectively conditioning a charge on the gate electrode of said second switching means with a signal from said second input node and then selectively isolating said second switching means gate electrode from said second input node; and
   wherein said first and second selective preconditioning and isolating means are each connected to receive said first timing pulses wherein said preconditioning occurs only in the presence of a said first timing pulse and said isolating occurs only in the absence of a said first timing pulse.

2. A high speed, low power drain, digital logic OR circuit, having a first input node, a second input node and an output node, wherein a logical OR function is provided at said output node, and operating in an environment having a first and a second distinct and non-overlapping timing pulses, said OR circuit providing an output responsive to a first signal received on the first input node and a second signal received on the second input node, wherein said OR circuit is preconditioned during said first timing pulse period and said logical OR function is performed at the output node only during said second timing pulse period, comprising;
   a first switching means having a conductive state, said first switching means being connected to said first input node for passing the first signal when in said conductive state;
   a second switching means having a conductive state, said second switching means being connected to said second input node for passing the second signal when in said conductive state;
   a third and fourth switching means each having a conductive state and each being connected to receive said second timing pulses, and to pass said timing pulses only when in said conductive state, to said output node;
   wherein said first and second switching means are each connected to received said first timing pulses, and wherein said first and second switching means are in the conductive state only in the presence of the first timing pulses;
   wherein the conductivity of said first switching means passes said first signal to condition said third switching means to conductivity, and the conductivity of said second switching means passes said second signal to condition said fourth switching means to conductivity; and
   wherein said second timing pulse appears after said first timing pulse whereby said logical OR function signal is clocked to said output node only in the presence of the second timing pulses.

3. The OR circuit of claim 2 also including means for promoting faster roll off of said OR function signal on said output node in the presence of a first timing pulse, said roll off means being connected to said output node, to ground and to receive said first timing pulses.

4. The OR circuit of claim 3 wherein said roll off means includes a fifth switching means having a conductive state and being connected to connect said output node to ground when a first timing pulse is received.

5. The OR circuit of claim 4 including means connected to said third and fourth switching means for increasing noise immunity thereof.

6. The OR circuit of claim 5 wherein said first switching means is a first field effect transistor connected on its drain electrode to said first input node and on its gate electrode to receive said first timing pulses; and wherein said second switching means is a second field effect transistor connected on its drain electrode to said second input node and on its gate electrode to receive said first timing pulses.

7. The OR circuit of claim 6 wherein said third switching means is a third field effect transistor connected on its drain electrode to receive said second timing pulses, on its gate electrode to the source electrode of said first field effect transistor and on its source electrode to said output node; and wherein said fourth switching means is a fourth field effect transistor connected on its drain electrode to said second input node, on its gate electrode to the source electrode of said second filed effect transistor and on its source electrode to said output node.

8. The OR circuit of claim 7 wherein said fifth switching means is a fifth field effect transistor connected on its drain electrode to said output node, on its source electrode to ground and on its gate electrode to receive said first timing pulses.

9. The OR circuit of claim 8 wherein said noise immunity increasing means includes a first capacitor connected between the gate electrode and source electrode of said third field effect transistor and a second capacitor connected between the gate electrode and the source electrode of said fourth effect transistor.

* * * * *